United States Patent
Parteder et al.

(10) Patent No.: US 12,211,769 B2
(45) Date of Patent: Jan. 28, 2025

(54) THROUGH-SUBSTRATE VIA AND METHOD FOR MANUFACTURING A THROUGH-SUBSTRATE VIA

(71) Applicant: ams AG, Premstätten (AT)

(72) Inventors: Georg Parteder, Einhoven (NL); Jochen Kraft, Einhoven (NL); Stefan Jessenig, Einhoven (NL)

(73) Assignee: AMS AG, Premstätten (AT)

( * ) Notice: Subject to any disclaimer, the term of this patent is extended or adjusted under 35 U.S.C. 154(b) by 414 days.

(21) Appl. No.: 17/639,736

(22) PCT Filed: Aug. 27, 2020

(86) PCT No.: PCT/EP2020/073957
§ 371 (c)(1),
(2) Date: Mar. 2, 2022

(87) PCT Pub. No.: WO2021/043661
PCT Pub. Date: Mar. 11, 2021

(65) Prior Publication Data
US 2022/0328380 A1 Oct. 13, 2022

(30) Foreign Application Priority Data
Sep. 3, 2019 (EP) .................... 19195145

(51) Int. Cl.
*H01L 23/48* (2006.01)
*H01L 21/768* (2006.01)

(52) U.S. Cl.
CPC ...... *H01L 23/481* (2013.01); *H01L 21/76898* (2013.01)

(58) Field of Classification Search
CPC .......... H01L 23/481; H01L 21/76898
See application file for complete search history.

(56) References Cited

U.S. PATENT DOCUMENTS

2007/0035020 A1 2/2007 Umemoto
2010/0123254 A1* 5/2010 Kraft ................. H01L 23/3178
257/773

(Continued)

FOREIGN PATENT DOCUMENTS

EP 3460835 A1 3/2019
JP 2006203176 A 8/2006

(Continued)

OTHER PUBLICATIONS

Ploner, Guido (EP Examiner), Extended European Search Report in corresponding EP Application No. 19195145.8 mailed on Feb. 24, 2020, 10 pages.

(Continued)

*Primary Examiner* — Britt D Hanley
*Assistant Examiner* — Victor V Barzykin
(74) *Attorney, Agent, or Firm* — MH2 Technology Law Group LLP

(57) ABSTRACT

An open through-substrate via, TSV, comprises an insulation layer disposed adjacent to at least a portion of side walls of a trench and to a surface of a substrate body. The TSV further comprises a metallization layer disposed adjacent to at least a portion of the insulation layer and to at least a portion of a bottom wall of said trench, a redistribution layer disposed adjacent to at least a portion of the metallization layer and a portion of the insulation layer disposed adjacent to the surface, and a capping layer disposed adjacent to at least a portion of the metallization layer and to at least a portion of the redistribution layer. The insulation layer and/or the capping layer comprise sublayers that are distinct from each other in terms of material properties. A first of the sublayers is disposed adjacent to at least a portion of the side walls and to at least a portion of the surface and a second of (Continued)

the sublayers is disposed adjacent to at least a portion of the surface.

18 Claims, 2 Drawing Sheets

(56) References Cited

U.S. PATENT DOCUMENTS

| | | |
|---|---|---|
| 2017/0162508 A1 | 6/2017 | Farooq et al. |
| 2018/0158941 A1 | 6/2018 | Birner et al. |
| 2019/0051575 A1* | 2/2019 | Kakuta ............... H01L 23/60 |

FOREIGN PATENT DOCUMENTS

| | | |
|---|---|---|
| JP | 2010161215 A | 7/2010 |
| JP | 2012253182 A | 12/2012 |
| JP | 2017157751 A | 9/2017 |
| WO | 2019057436 A1 | 3/2019 |

OTHER PUBLICATIONS

Ploner, Guido (EP Examiner), International Search Report and Written Opinion in corresponding International Application No. PCT/EP2020/073957 mailed on Sep. 23, 2020, 14 pages.

* cited by examiner

THROUGH-SUBSTRATE VIA AND METHOD FOR MANUFACTURING A THROUGH-SUBSTRATE VIA

CROSS-REFERENCE TO RELATED APPLICATIONS

The present application is the national stage entry of International Patent Application No. PCT/EP2020/073957, filed on Aug. 27, 2020, and published as WO 2021/043661 A1 on Mar. 11, 2021, which claims the benefit of priority of European Patent Application No. 19195145.8, filed on Sep. 3, 2019, all of which are incorporated by reference herein in their entirety.

FIELD OF THE INVENTION

The present invention relates to an open through-substrate via and to a method for manufacturing an open through-substrate via.

BACKGROUND OF THE INVENTION

For electrically contacting an integrated circuit of a semiconductor device or another part of a semiconductor device, a common method is to form a through-substrate via, TSV, through the substrate of the device. Therefore, a trench is formed in the substrate. The trench is at least partially filled with an electrically conductive contact material and this contact material is electrically isolated against the substrate. An integrated circuit, which may be arranged at a circuit side of the substrate, can be electrically contacted via the TSV. The TSV can be electrically contacted at a contact side of the substrate facing away from a circuit side of the substrate by means of a solder bump. In this way, the device or the integrated circuit can be electrically contacted from the contact side of the substrate.

For realizing the above-mentioned TSV structures, different material layers are employed. The electrical insulation between the electrically conductive contact material, which typically is a metal, and the substrate, which typically is a silicon substrate, is achieved by means of an insulation layer such as a silicon dioxide layer. In addition, a capping layer may be employed in order to protect certain parts of the TSV and/or remaining parts of the semiconductor device.

However, the different materials employed may possess significantly distinct material properties such as different values for Young's modulus. This may in turn lead to large stress gradients between the different layers which potentially lead to unwanted strain in the finalized devices and hence to an increased cracking probability. Conventional approaches employ a high stress insulation layer in order to compensate for any stress formed in the remaining layers. However, this approach may lead to an increased cracking probability inside the trench of the TSV.

It is an object of the invention to provide an improved concept for a TSV structure with increased stress compensation. This object is achieved with the subject-matter of the independent claim. Further developments and embodiments are described in the dependent claims.

The improved concept is based on the idea of depositing an insulation layer and/or a capping layer during the manufacturing of the TSV as sublayers. These sublayers possess different intrinsic stress such that any unwanted significant strain of the finalized device is prevented, while maintaining an insignificant cracking probability particularly in the TSV region of the finalized device.

SUMMARY OF THE INVENTION

An open TSV according to the improved concept comprises a substantially planar substrate body including a semiconducting portion and an interlayer dielectric portion disposed adjacent to the semiconducting portion, wherein the semiconducting portion has a surface. The TSV further comprises a trench extending from the surface at least through the semiconducting portion, wherein the trench is characterized by side walls and a bottom wall. The TSV further comprises an insulation layer that is disposed adjacent to at least a portion of the side walls and the surface, a metallization layer that is disposed adjacent to at least a portion of the insulation layer and to at least a portion of the bottom wall, and a redistribution layer that is disposed adjacent to at least a portion of the metallization layer and a portion of the insulation layer disposed adjacent to the surface. The TSV further comprises a capping layer that is disposed adjacent to at least a portion of the metallization layer and to at least a portion of the redistribution layer.

The insulation layer and/or the capping layer comprise sublayers that are distinct from each other in terms of material properties. A first of the sublayers is disposed adjacent to at least a portion of the side walls and to at least a portion of the surface. A second of the sublayers is disposed adjacent to at least a portion of the surface.

The substrate body, for example, comprises a semiconductor substrate as the semiconducting portion. The semiconductor substrate is a silicon substrate, for instance. The interlayer dielectric portion, for example, comprises metal layers that are insulated from each other by means of an interlayer dielectric such as an oxide and form active circuitry of an integrated circuit, for instance. The interlayer dielectric portion is arranged on a substrate surface of the semiconducting portion. For example, the interlayer dielectric portion is arranged on a processed surface of the semiconducting portion which may be referred to as a top side of the silicon substrate. The TSV is realized by first forming a trench that extends from the surface of the substrate body that faces away from the interlayer dielectric portion through at least the semiconducting portion and optionally partially through the interlayer dielectric portion in a vertical or in a substantially vertical direction. The surface of the semiconducting portion may be referred to as the bottom surface of the substrate. "Vertical" in this context refers to the direction that is perpendicular to said surface of the substrate body. The trench is characterized by side walls that are oriented perpendicular or substantially perpendicular to the surface and by a bottom wall that is parallel or substantially parallel to the surface.

The insulation layer is disposed adjacent to at least a portion of the side walls and to the surface. For example, the insulation layer is a conformal type layer that covers at least a portion of, or optionally the entire, side walls of the trench. The insulation layer may be disposed immediately adjacent to, i.e. directly in contact with, the side walls. Alternatively, an additional layer may be arranged between the side walls of the trench and the portion of the insulation layer that covers the side walls. Furthermore, the insulation layer covers at least a portion of the surface. Analogous to the portion of the insulation layer that covers the side walls, the portion of the insulation layer covering the surface may be either immediately adjacent to, i.e. in direct contact with, the surface or an additional layer may be arranged in between the surface and said portion of the insulation layer.

The metallization layer is disposed adjacent to the bottom wall and to the portion of the insulation layer that is disposed adjacent to the side walls. This means that the metallization layer is disposed within the trench. Analogously to the arrangement of the insulation layer described above, adjacent may indicate an immediate adjacent arrangement or alternatively the arrangement of an additional layer in between the insulation layer and the metallization layer. The metallization layer is of an electrically conductive material such as a metal.

The redistribution layer, like the metallization layer, is also of an electrically conductive material. For example, the material of the metallization layer and that of the redistribution layer are the same. The redistribution layer is disposed immediately adjacent to at least a portion of the metallization layer and adjacent to the portion of the insulation layer that is adjacent to the surface. In particular, the metallization layer is in electrical contact with said portion of the metallization layer and hence may extend partially into the trench. In some embodiments, the metallization layer and the redistribution layer are disposed as a single layer, such as a conformal metal layer, for instance.

The capping layer is disposed such that the metallization layer and the redistribution layer are covered by said capping layer in region of the trench, for instance. The capping layer may be of a material that is the same as a material of the insulation layer. The capping layer may serve as a protective layer and/or as a stress compensation layer that compensates stress formed within and/or across the remaining layers.

The insulation layer and/or the capping layer comprise sublayers. This means that the insulation layer and/or the capping layer is formed by means of depositing at least two sublayers. For example, the insulation layer and/or the capping layer comprise a first and a second of the sublayers wherein the first may be a conformal layer disposed adjacent to a portion of the side walls and to a portion of the surface, while the second may be a non-conformal layer disposed adjacent to the portion of the first sublayer that is disposed adjacent to said portion of the surface.

The sublayers are distinct from each other in terms of material properties. For example, the sublayers are of different materials or they are of the same material but have different material properties that follow from different compositions and/or deposition methods, for instance. For example, the first and the second of the sublayers differ from each other in terms of intrinsic stress, a material composition and/or a microstructure.

Since a high amount of intrinsic stress inside the trench is not desirable as it may lead to an increased cracking probability, the second of the sublayers may be a non-conformal layer as described above and may have an intrinsic stress that is larger than that of the first of the sublayers, which may be a conformal layer. This way, intrinsic stress formed by, i.e. within or across, the other layers of the TSV may be compensated in a manner that a significant strain in the finalized TSV is prevented, while at the same time avoiding significant intrinsic stress inside the trench of the TSV.

In some embodiments, the insulation layer comprises a first and a second insulation sublayer, wherein the first insulation layer is disposed adjacent to at least a portion of the side walls and to at least a portion of the surface. Moreover, the second insulation sublayer is disposed immediately adjacent to the first insulation sublayer and adjacent to at least a portion of the surface.

In these embodiments, the first insulation sublayer corresponds to the first of the sublayers, while the second insulation sublayer corresponds to the second of the sublayers.

In some embodiments, the capping layer comprises a first and a second capping sublayer, wherein the first capping sublayer is disposed adjacent to at least a portion of the side walls and to at least a portion of the surface. Moreover, the second capping sublayer is disposed immediately adjacent to the first capping sublayer and adjacent to at least a portion of the surface.

In these embodiments, the first capping sublayer corresponds to the first of the sublayers, while the second capping sublayer corresponds to the second of the sublayers.

Depending on the manufacturing process, either the insulation or the capping layer may be formed by depositing sublayers as described above. Alternatively, both the insulation layer and the capping layer may both be formed by means of depositing respective sublayers.

In some embodiments, the first of the sublayers is arranged between the surface and the second of the sublayers. In some alternative embodiments, the second of the sublayers is arranged between the surface and the first of the sublayers.

Depending on the manufacturing process, the second of the sublayers may be either deposited before or after the first of the sublayers. This means that the second of the sublayers that may be a non-conformal layer is arranged either at a larger or at a smaller distance from the surface of the substrate body compared to the first of the sublayers that may be a conformal layer.

In some embodiments, the first of the sublayers has a tensile type or a compressive type of intrinsic stress, and the second of the sublayers has an intrinsic stress of the respective other type.

In some alternative embodiments, the first of the sublayers is characterized by a tensile type or a compressive type of intrinsic stress, and the second of the sublayers is characterized by an intrinsic stress of the same respective type but different magnitude than that of the first of the sublayers.

Depending on what type of intrinsic stress the remaining layers exhibit, the sublayers may be either both of a compressive or tensile type or they have different types of stress. For example, the first of the sublayers is a conformal layer that extends into the trench and has a compressive type of intrinsic stress. However, this stress may be chosen to be smaller than that required in order to compensate for intrinsic stress generated by the remaining layers in order to reduce the cracking probability within the trench. The second of the sublayers in this example, which may be a non-conformal layer, may possess a compressive type of intrinsic stress larger than that of the first of the sublayers in order to compensate for said intrinsic stress generated by the remaining layers. If said intrinsic stress generated by the remaining layers is of a compressive type, the first of the sublayers may still be chosen to have a compressive type as well while the second of the sublayers has a tensile type of intrinsic stress in order to compensate for stress formed within or across the first sublayer and the remaining layers. This scenario is relevant for cases in which an overall small compressive stress is desired within the trench of the TSV for further reduction of the cracking probability.

In some embodiments, the trench extends at least partially into the dielectric portion.

Contact layers may be buried within the dielectric portion. In order for the TSV to electrically contact these contact layers, the trench in these embodiments is required to extend partially into the dielectric portion.

In some embodiments, the insulation layer and/or the capping layer are of a dielectric material such as an oxide.

Dielectric materials such as silicon dioxide or silicon nitride are suitable materials for achieving electrical insulation while keeping the overall manufacturing process simple. Furthermore, the insulation layer and the capping layer may be of the same material.

In some embodiments, the first of the sublayers is of a material that is based on a tetraethoxysilane, TEOS, precursor, and the second of the sublayers is of a material that is based on a silane precursor that is different from TEOS.

In order to achieve the sublayers with different intrinsic stress types and/or values, the sublayers may be formed from different precursors. For example, the first of the sublayers is formed from a TEOS precursor while the second of the sublayers is formed from a different silane precursor.

In some embodiments, the metallization layer and the redistribution layer are arranged between the insulation layer and the capping layer.

The object is further solved by a semiconductor device comprising an open TSV according to one of the embodiments described above. The semiconductor device may be any type of device that employs open TSVs to provide electrical connection of an integrated circuit through a substrate.

Examples for such devices include ASICs that are commonly employed in sensors such as environmental sensors and image sensors.

The object is further solved by a method for manufacturing an open through-substrate via, TSV, wherein the method comprises providing a substantially planar substrate body including a semiconducting portion and an interlayer dielectric portion that is disposed adjacent to the semiconducting portion, wherein the semiconducting portion has a surface. The method further comprises forming a trench that extends from the surface at least through the semiconducting portion and is characterized by side walls and a bottom wall, depositing an insulation layer onto at least a portion of the side walls and onto at least a portion of the surface, and depositing a metallization layer onto at least a portion of the insulation layer that is disposed adjacent to the side walls and onto at least a portion of the bottom wall. The method further comprises depositing a redistribution layer onto at least a portion of the metallization layer and onto at least a portion of the insulation layer that is disposed adjacent to the surface. The method further comprises depositing a capping layer onto at least a portion of the metallization layer and onto at least a portion of the redistribution layer. The insulation layer and/or the capping layer are deposited as sublayers that are distinct from each other in terms of material properties. A first of the sublayers is deposited adjacent to at least a portion of the side walls and to at least a portion of the surface. A second of the sublayers is deposited adjacent to at least a portion of the surface.

Further embodiments of the method become apparent to the skilled reader from the embodiments of the open through-substrate via described above.

The following description of figures of exemplary embodiments may further illustrate and explain aspects of the improved concept. Components and parts of the open TSV with the same structure and the same effect, respectively, appear with equivalent reference symbols. Insofar as components and parts of the open TSV correspond to one another in terms of their function in different figures, the description thereof is not repeated for each of the following figures.

DETAILED DESCRIPTION

Figure 1:
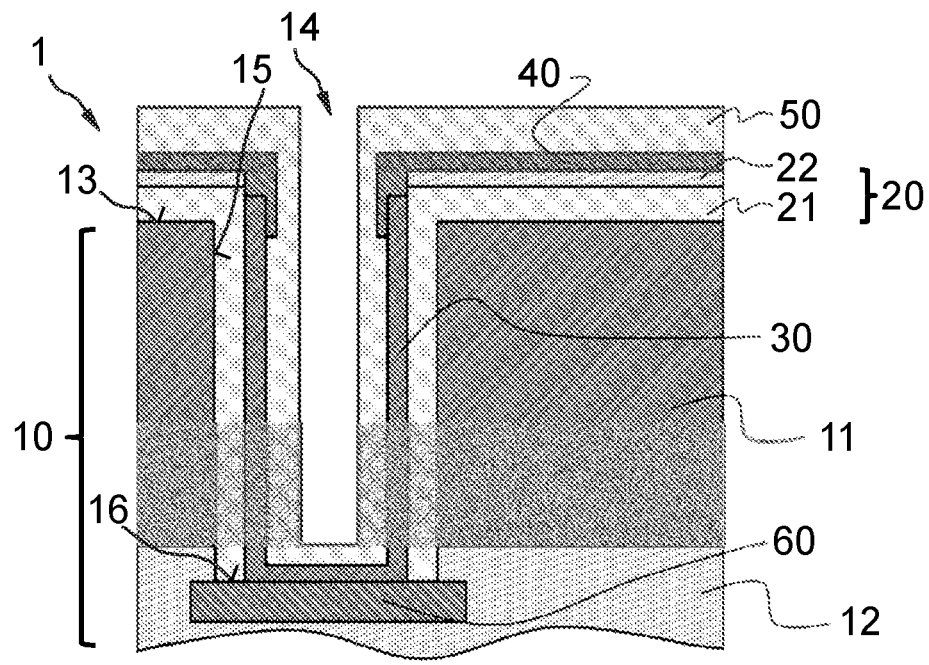
FIGS. 1 to 3 show cross-section views of exemplary embodiments of an open TSV according to the improved concept.

FIG. 1 shows an exemplary embodiment of an open TSV 1 according to the improved concept. In this embodiment, the insulation layer 20 comprises a first and a second sublayer 21, 22.

In detail, the embodiment shown comprises a substrate body 10 that has a semiconducting portion 11 and an interlayer dielectric portion 12. For example, the semiconducting portion 11 is a silicon substrate. The semiconducting portion 11 comprises a surface 13 that is arranged on the side of the semiconducting portion 11 that faces away from the interlayer dielectric portion 12. For example, the surface 13 is a process surface such as a polished surface. Typically, this surface 13 is referred to as the backside of the semiconducting portion 11.

The interlayer dielectric portion 12 is arranged adjacent to a further surface, typically a processed surface referred to as the top surface of the semiconducting portion 11, of the semiconducting portion 11 that faces away from the surface 13. For example, the interlayer dielectric portion 12 is arranged immediately adjacent to the semiconducting portion 11, i.e. the interlayer dielectric portion 12 is in direct contact with the semiconducting portion 11. The interlayer dielectric portion 12 comprises metal contact layers 60 that are insulated from each other by means of an interlayer dielectric such as an oxide and form active circuitry of an integrated circuit, for instance. For illustration purposes, FIG. 1 only shows a single contact layer 60.

The TSV 1 further comprises a trench 14 that X tends from the surface 13 at least through the semiconducting portion 11 and optionally, as illustrated here, partially through the interlayer dielectric portion 12. The trench 14 is characterized by side walls 15 that extend vertically, i.e. in a direction perpendicular to the surface 13, and a bottom wall 16 that extends horizontally, i.e. in a direction parallel to the surface 13. The trench 14 may be configured to expose a contact surface of a contact layer 60 arranged within the interlayer dielectric portion 12.

The surface 13 and the side walls 15 are covered by the insulation layer 20. To this end, in this embodiment the insulation layer 20 comprises sublayers 21, 22, which may be referred to as the first insulation sublayer and the second insulation sublayer. The first of the sublayers 21 in this embodiment is a conformal layer extending into the trench 14, i.e. it covers both at least portions of the surface 13 and at least portions of the side walls 15 with a substantially identical thickness. The thickness is measured in a perpendicular direction with respect to the surface 13 and the side walls 15. The second of the sublayers 22 in this embodiment is a non-conformal layer, i.e. it covers at least portions of the surface 13 without extending into the trench 14.

The first and the second of the sublayers 21, 22 differ from each other in terms of material properties such as intrinsic stress. For example, the first of the sublayers 21 is based on a tetraethoxysilane, TEOS, precursor while the second of the sublayers 22 is based on a different silane precursor. In this way, the first of the sublayers 21 may be characterized by a certain intrinsic stress while the second of the sublayers 22 has an intrinsic stress larger than that of the first of the sublayers 21. Hence, the overall intrinsic stress inside the trench 14 is capped at a level at which the cracking probability is insignificant. Outside the trench 14, the second of the sublayers 22 in this embodiment serves the purpose of compensating intrinsic stress formed within or across the substrate body 10 and the remaining layers 30, 40, 50. The sublayers 21, 22 can be distinguished and/or identified by means of a short hydrofluoric etch as they possess significantly distinct etch rates.

The insulation layer 20 in this embodiment is disposed immediately adjacent to the substrate body 10. In alternative embodiments, additional layers may be arranged in between the insulation layer 20 and the substrate body 10. Examples of such additional layers include adhesive promoting layers. Moreover, in alternative embodiments, the first of the sublayers 21 may be a non-conformal layer while the second of the sublayers 22 may be a conformal layer extending into the trench 14.

The insulation layer 20 is covered by a metallization layer 30 and a redistribution layer 40. The metallization layer 30 is configured to cover at least portions of the insulation layer 20 that is disposed adjacent to the side walls 15 as well as the bottom wall 16. Optionally, the metallization layer 30 is arranged immediately adjacent to, i.e. in contact with, a contact layer 60. The redistribution layer 40 is configured to cover at least portions of the metallization layer 30 and at least portions of the insulation layer 20 that is disposed adjacent to the surface 13. In this embodiment, the metallization layer 30 is disposed immediately adjacent to the bottom wall 16 and to the insulation layer 20, i.e. the first of the sublayers 21. In alternative embodiments not shown, additional layers may be arranged in between the insulation layer 20 and the metallization layer 30.

The redistribution layer 40 is arranged immediately adjacent to the metallization layer 30, i.e. said layers are in direct contact with each other. To this end, the redistribution layer extends at least partially into the trench 14. The metallization layer 30 and the redistribution layer 40 are of an electrically conductive materials such as metals. For example, the metallization layer 30 and the redistribution layer 40 of the same material such as tungsten. Likewise, the contact layer 60 is of an electrically conductive material, such that the metallization layer 30 provides an electrically conductive connection between the contact layer 60 and the redistribution layer 40, wherein the latter may be in electrical contact with contact pads. Alternatively, the redistribution layer 40 may be at least partially exposed in order to form contact pads.

A capping layer 50 is disposed adjacent to at least a portion of the metallization layer 30 and to at least a portion of the redistribution layer 40. The capping layer 50 may serve as a protective layer and/or for stress compensation and may be of a semiconductor material such as an oxide. For example, the material of the capping layer 50 corresponds to a material of the insulation layer 20. In this embodiment, the capping layer 50 is disposed immediately adjacent to the metallization layer 30 and the redistribution layer 40. In alternative embodiments not shown, additional layers may be arranged in between the capping layer 50 and the metallization and redistribution layers 30, 40.

The intrinsic stress of the first and the second of the sublayers 21, 22 is chosen in such a manner that an overall strain of the TSV 1 is prevented. For example, the intrinsic stress of the first of the sublayers 21 is chosen in the way that the overall stress resulting from the substrate body 10 and all layers 20, 30, 40, 50 within the trench 14 is substantially zero. The metallization layer 30 for example has a tensile type stress, which is typical for tungsten, such that a material of the first of the sublayers 21 is chosen to have an intrinsic stress of substantially the same magnitude but of a compressive type. In order to compensate for a global compressive or tensile stress, the second of the sublayers 22 is consequently chosen to have a stress necessary for the desired compensation. For example, an intrinsic stress of the second of the sublayers 22 is compressive or tensile with a magnitude larger than the intrinsic stress of the first of the sublayers 21. The intrinsic stress is controlled during deposition of the respective sublayer, for instance.

Figure 2:
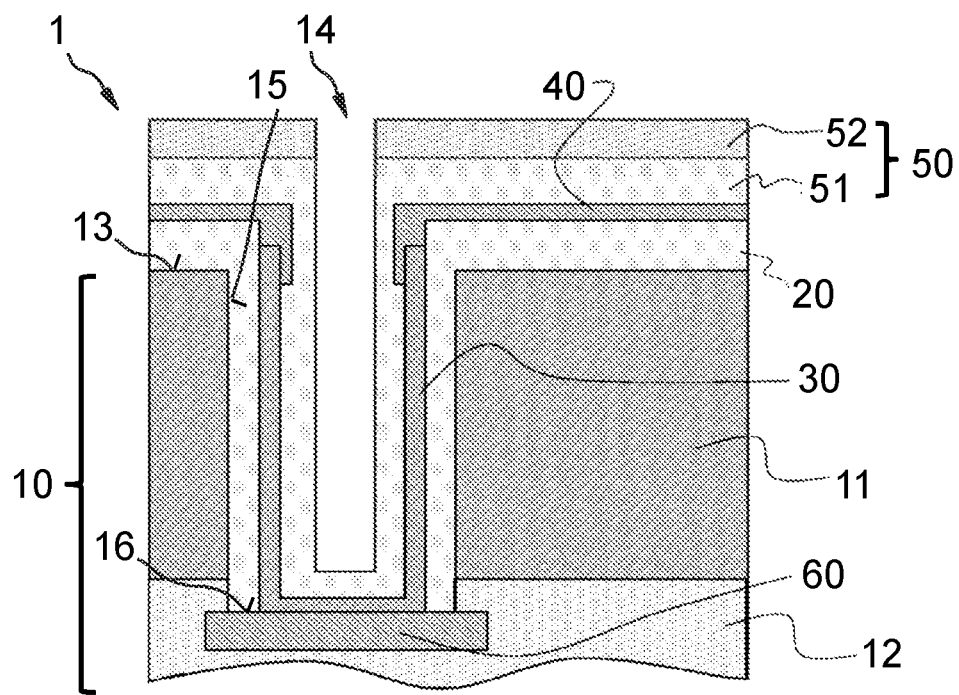

FIG. 2 shows an alternative exemplary embodiment of an open TSV 1. In this embodiment, the insulation layer 20 is a single layer extending into the trench 14 in order to cover both the surface 13 and the side walls 15. For example, the insulation layer 20 in this embodiment is a conformal layer. However, a thickness of the portion of the insulation layer 20 that is disposed adjacent to the surface 13 may be different than a thickness of the portion of the insulation layer 20 that is disposed adjacent to the side walls 15. For example, the latter thickness is smaller than the former thickness in order to keep the overall stress within the trench 14 at a low level.

In contrast to the embodiment shown in FIG. 1, in this embodiment the capping layer 50 comprises sublayers 51, 52. Similar to the embodiment of FIG. 1, the first of the sublayers 51, which may be referred to as the first capping sublayer, in this embodiment is a conformal layer covering the surface 13 and extending into the trench 14 for covering the sidewalls 15 and the bottom wall 16. The first of the sublayers 51 in this embodiment is disposed immediately adjacent to the redistribution layer 40 and the metallization layer 30. In alternative embodiments not shown, additional layers may be arranged in between said layers.

The second of the sublayers 52, which may be referred to as the second capping sublayer, in this embodiment is a non-conformal layer covering the surface 13 without extending into the trench 14. The second of the sublayers 52 in this embodiment is disposed immediately adjacent to the first of the sublayers 51. In alternative embodiments not shown, the second of the sublayers 52 may be arranged in between the redistribution layer 40 and the first of the sublayers 51. In other words, the one of the sublayers that is arranged closest to the surface 13 may be a non-conformal layer while the respective other of the sublayers is a conformal layer in said alternative embodiments.

In this embodiment, the sublayers 51, 52 of the capping layer 50 serve the purpose of stress compensation similar to the sublayers 21, 22 of the embodiment shown in FIG. 1. For example, the first of the sublayers 51 is based on a TEOS precursor while the second of the sublayers 52 is based on the different silane precursor analogous to the embodiment shown in FIG. 1. In this embodiment, a material of the capping layer 50 corresponds to the material of the insulation layer 20, for instance.

Figure 3:
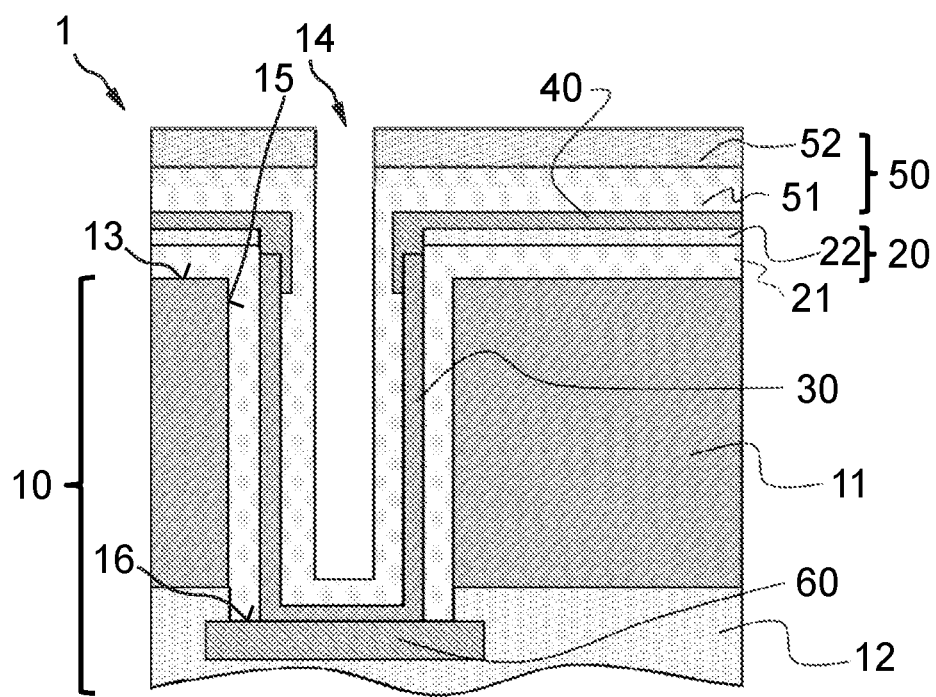

FIG. 3 shows an alternative exemplary embodiment of an open TSV 1. This embodiment combines the sublayer options of the embodiments shown in FIGS. 1 and 2. In detail, both the insulation layer 20 and the capping layer 50 comprises sublayers 21, 22, 51, 52 according to the embodiments described above. Forming both the insulation layer 20 and the capping layer 50 from sublayers 21, 22, 51, 52 may serve the purpose of compensating for a substantial overall stress formed by the substrate body 10 and the remaining layers 30, 40.

For example, the material of the first capping sublayer 51 corresponds to the material of the first insulation sublayer 21 while the material of the second capping sublayer 52 corresponds to the material of the second insulation sublayer 22. Alternatively, all sublayers 21, 22, 51, 52 are different materials based on different precursors, for instance.

The embodiments shown in the FIGS. 1 to 3 as stated represent exemplary embodiments of the TSV 1, therefore they do not constitute a complete list of all embodiments according to the improved concept. Actual TSV configurations may vary from the embodiments shown in terms of shape, size and materials, for example.

A TSV 1 according to one of the embodiments shown may be conveniently employed in a semiconductor device that require a low level of global stress in order to prevent cracking from strain formed from said stress. Possible applications include semiconductor devices in which a TSV according to the improved concept is employed for providing electrical connection of an integrated circuit through a substrate. Examples for such devices include ASICs that are commonly employed in sensors such as environmental sensors and image sensors.

The invention claimed is:

1. An open through-substrate via, TSV, the through-substrate via comprising
    a substantially planar substrate body including a semiconducting portion and an interlayer dielectric portion disposed adjacent to the semiconducting portion, the semiconducting portion having a surface;
    a trench extending from the surface at least through the semiconducting portion, the trench being characterized by side walls and a bottom wall;
    an insulation layer disposed adjacent to at least a portion of the side walls and the surface;
    a metallization layer disposed adjacent to at least a portion of the insulation layer and to at least a portion of the bottom wall;
    a redistribution layer disposed adjacent to at least a portion of the metallization layer and a portion of the insulation layer disposed adjacent to the surface; and
    a capping layer disposed adjacent to at least a portion of the metallization layer and to at least a portion of the redistribution layer; wherein
    the insulation layer and/or the capping layer comprise sublayers that are distinct from each other in terms of material properties;
    a first of the sublayers is disposed adjacent to at least a portion of the side walls and to at least a portion of the surface;
    a second of the sublayers is disposed adjacent to at least a portion of the surface;
    the first of the sublayers has a tensile type or a compressive type of intrinsic stress; and
    the second of the sublayers has an intrinsic stress of the respective other type or of the same respective type but different magnitude than that of the first of the sublayers.

2. The open TSV according to claim 1, wherein the first of the sublayers is a conformal layer and the second of the sublayers is a non-conformal layer.

3. The open TSV according to claim 1, wherein the insulation layer comprises a first and a second insulation sublayer, wherein
    the first insulation sublayer is disposed adjacent to at least a portion of the side walls and to at least a portion of the surface; and
    the second insulation sublayer is disposed immediately adjacent to the first insulation sublayer and adjacent to at least a portion of the surface.

4. The open TSV according to claim 1, wherein the capping layer comprises a first and a second capping sublayer, wherein
    the first capping sublayer is disposed adjacent to at least a portion of the side walls and to at least a portion of the surface; and
    the second capping sublayer is disposed immediately adjacent to the first capping sublayer and adjacent to at least a portion of the surface.

5. The open TSV according to claim 1, wherein the first of the sublayers is arranged between the surface and the second of the sublayers.

6. The open TSV according to claim 1, wherein the second of the sublayers is arranged between the surface and the first of the sublayers.

7. The open TSV according to claim 1, wherein the first and the second of the sublayers differ from each other in terms of intrinsic stress, a material composition and/or a microstructure.

8. The open TSV according to claim 1, wherein the trench extends at least partially into the dielectric portion.

9. The open TSV according to claim 1, wherein the insulation layer and/or the capping layer are of a dielectric material.

10. The open TSV according to claim 1, wherein
    the first of the sublayers is of a material that is based on a tetraethoxysilane, TEOS, precursor; and
    the second of the sublayers is of a material that is based on a silane precursor that is different from TEOS.

11. The open TSV according to claim 1, wherein the metallization layer and the redistribution layer are arranged between the insulation layer and the capping layer.

12. The open TSV according to claim 1, wherein the second of the sublayers does not extend into the trench.

13. The open TSV according to claim 1, wherein the second of the sublayers is disposed on the first of the sublayers.

14. The open TSV according to claim 1, wherein the first of the sublayers is disposed on the second of the sublayers.

15. The open TSV according to claim 1, wherein
    the insulation layer is disposed on at least a portion of the side walls and the surface;
    the metallization layer is disposed on the insulation layer within the trench and on the bottom wall;
    the redistribution layer is disposed on the insulation layer outside the trench; and
    the capping layer is disposed on the metallization layer and the redistribution layer (40).

16. A semiconductor device comprising an open TSV according to claim 1.

17. A method for manufacturing an open through-substrate via, TSV, the method comprising
    providing a substantially planar substrate body including a semiconducting portion and an interlayer dielectric portion disposed adjacent to the semiconducting portion, the semiconducting portion having a surface;
    forming a trench (14) that extends from the surface at least through the semiconducting portion and is characterized by side walls and a bottom wall;
    depositing an insulation layer onto at least a portion of the side walls and onto at least a portion of the surface;
    depositing a metallization layer onto at least a portion of the insulation layer that is disposed adjacent to the side walls and onto at least a portion of the bottom wall;

depositing a redistribution layer onto at least a portion of the metallization layer and onto at least a portion of the insulation layer that is disposed adjacent to the surface; and depositing a capping layer onto at least a portion of the metallization layer and to at least a portion of the redistribution layer; wherein the insulation layer and/or the capping layer are deposited as sublayers that are distinct from each other in terms of material properties;

a first of the sublayers is deposited adjacent to at least a portion of the side walls and to at least a portion of the surface;

a second of the sublayers is deposited adjacent to at least a portion of the surface the first of the sublayers has a tensile type or a compressive type of intrinsic stress; and the second of the sublayers has an intrinsic stress of the respective other type or of the same respective type but different magnitude than that of the first of the sublayers.

18. An open through-substrate via, TSV, the through-substrate via comprising a substantially planar substrate body including a semiconducting portion and an interlayer dielectric portion disposed adjacent to the semiconducting portion, the semiconducting portion having a surface;

a trench extending from the surface at least through the semiconducting portion, the trench being characterized by side walls and a bottom wall;

an insulation layer disposed adjacent to at least a portion of the side walls and the surface;

a metallization layer disposed adjacent to at least a portion of the insulation layer and to at least a portion of the bottom wall;

a redistribution layer disposed adjacent to at least a portion of the metallization layer and a portion of the insulation layer disposed adjacent to the surface; and a capping layer disposed adjacent to at least a portion of the metallization layer and to at least a portion of the redistribution layer; wherein the insulation layer and/or the capping layer comprise sublayers that are distinct from each other in terms of material properties;

a first of the sublayers is disposed adjacent to at least a portion of the side walls and to at least a portion of the surface;

a second of the sublayers is disposed adjacent to at least a portion of the surface; and the second of the sublayers does not extend into the trench.

* * * * *